(12) United States Patent
Shin et al.

(10) Patent No.: US 10,388,381 B2
(45) Date of Patent: Aug. 20, 2019

(54) SEMICONDUCTOR MEMORY DEVICE AND OPERATING METHOD THEREOF

(71) Applicant: SK hynix Inc., Gyeonggi-do (KR)

(72) Inventors: Jae Hyeon Shin, Gyeonggi-do (KR); Sung Hyun Hwang, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/973,865

(22) Filed: May 8, 2018

(65) Prior Publication Data
US 2019/0066793 A1 Feb. 28, 2019

(30) Foreign Application Priority Data
Aug. 30, 2017 (KR) .................. 10-2017-0110270

(51) Int. Cl.
| | |
|---|---|
| *G11C 16/04* | (2006.01) |
| *G11C 16/10* | (2006.01) |
| *G11C 16/08* | (2006.01) |
| *G11C 16/30* | (2006.01) |
| *G11C 16/34* | (2006.01) |
| *G11C 16/32* | (2006.01) |

(52) U.S. Cl.
CPC .......... *G11C 16/10* (2013.01); *G11C 16/0483* (2013.01); *G11C 16/08* (2013.01); *G11C 16/30* (2013.01); *G11C 16/3427* (2013.01); *G11C 16/0466* (2013.01); *G11C 16/32* (2013.01)

(58) Field of Classification Search
CPC ..... G11C 16/10; G11C 16/0483; G11C 16/08; G11C 6/3427; G11C 16/0466; G11C 16/32; G11C 16/30
See application file for complete search history.

(56) References Cited

U.S. PATENT DOCUMENTS

| | | | |
|---|---|---|---|
| 2006/0092703 A1* | 5/2006 | Chae ...................... | G11C 16/10 365/185.18 |
| 2009/0257280 A1* | 10/2009 | Oh ...................... | G11C 16/0483 365/185.19 |
| 2009/0262582 A1* | 10/2009 | Chae ...................... | G11C 16/10 365/185.19 |
| 2011/0134694 A1* | 6/2011 | Lee ...................... | G11C 11/5628 365/185.03 |
| 2011/0286265 A1 | 11/2011 | Mokhlesi et al. | |

FOREIGN PATENT DOCUMENTS

KR 1020140079913 6/2014

* cited by examiner

*Primary Examiner* — Gene N Auduong
(74) *Attorney, Agent, or Firm* — IP & T Group LLP

(57) ABSTRACT

A semiconductor memory device includes a memory cell array coupled to a plurality of word lines, a voltage generator generating a program voltage and first and second pass voltages in response to voltage generation control signals, an address decoder selectively applying the program voltage and the first and second pass voltages to the plurality of word lines in response to address decoder control signals, and a control logic controlling the voltage generator and the address decoder to perform a program operation.

20 Claims, 10 Drawing Sheets

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2017-0110270, filed on Aug. 30, 2017, the entire disclosure of which is herein incorporated by reference in its entirety.

BACKGROUND

1. Field of Invention

Various embodiments of the invention relate generally to an electronic device. Particularly, the embodiments relate to a semiconductor memory device and a method of operating the same.

2. Description of Related Art

Semiconductor devices, in particular, semiconductor memory devices, may be classified into volatile memory devices and nonvolatile memory devices.

A nonvolatile memory device may have comparatively low write and read speeds, but may retain data stored therein even when power is turned off. Therefore, the nonvolatile memory device may be used when there is a need for storing data which should be retained regardless of supply of power. Examples of the non-volatile memory devices may include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM), and Ferroelectric RAM (FRAM). Flash memories may be classified into NOR-type memories or NAND-type memories.

Among these nonvolatile memory devices, a flash memory device may have both advantages of RAM in which data is programmable and erasable and advantages of ROM in which data stored therein can be retained even when power is interrupted. Flash memories have been widely used as the storage media of portable electronic devices such as mobile phones, digital cameras, personal digital assistants (PDAs), and MP3 players.

SUMMARY

Various embodiments are directed to a semiconductor memory device capable of improving a program disturb phenomenon, and a method of operating the same.

According to an embodiment, a semiconductor memory device may include a memory cell array coupled to a plurality of word lines, a voltage generator generating a program voltage and first and second pass voltages in response to voltage generation control signals, an address decoder selectively applying the program voltage and the first and second pass voltages to the plurality of word lines in response to address decoder control signals, and a control logic controlling the voltage generator and the address decoder to perform a program operation, wherein the control logic comprises a voltage generation control circuit generating the voltage generation control signals for controlling the peripheral circuit to generate the first pass voltage and the second pass voltage having rising periods different from each other, and an address decoder control circuit generating the address decoder control signals for controlling the peripheral circuit to apply the program voltage to a selected word line, among the plurality of word lines, to apply the first pass voltage to first word lines adjacent to the selected word line, and to apply the second pass voltage to second word lines, except the first word lines and the selected word line.

According to an embodiment, a semiconductor memory device may include a memory cell array including a plurality of memory cells coupled to a plurality of word lines, respectively, a voltage generator outputting a program voltage, a first pass voltage, and a second pass voltage during a program operation, an address decoder selectively applying the program voltage and the first and second pass voltages output from the voltage generator in response to the plurality of word lines, and a control logic controlling the voltage generator and the address decoder to apply the program voltage to a selected word line, among the plurality of word lines, the first pass voltage to first word lines adjacent to the selected word line, and the second pass voltage to second word lines, among the plurality of word lines, except the selected word line and the first word lines, during the program operation, wherein the control logic controls the voltage generator so that the first pass voltage and the second pass voltage increase from a first level to a second level and have rising slopes different from each other.

According to an embodiment, a method of operating a semiconductor memory device may include applying a program voltage consisting of a first program voltage and a second program voltage to a selected memory cell, and applying a first pass voltage to memory cells adjacent to the selected memory cell and applying a second pass voltage to remaining unselected memory cells, wherein the first pass voltage and the second pass voltage have rising periods increasing from a first level to a second level and differing from each other.

DETAILED DESCRIPTION

Hereinafter, example embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the example embodiments to those skilled in the art.

It will be understood that when an element is referred to as being "coupled" or "connected" to a certain element, it may be directly coupled or connected to the certain element or may be indirectly coupled or connected to the certain element, with intervening elements being present therebetween. In the specification, when an element is referred to as "comprising" or "including" a component, it does not exclude other components but may further include other components unless a description to the contrary is specifically pointed out in context.

The terminology used herein is for the purpose of describing particular embodiments only and is not intended to be limiting of the present invention.

Hereinafter, the various embodiments of the present invention will be described in detail with reference to the attached drawings.

Figure 1:
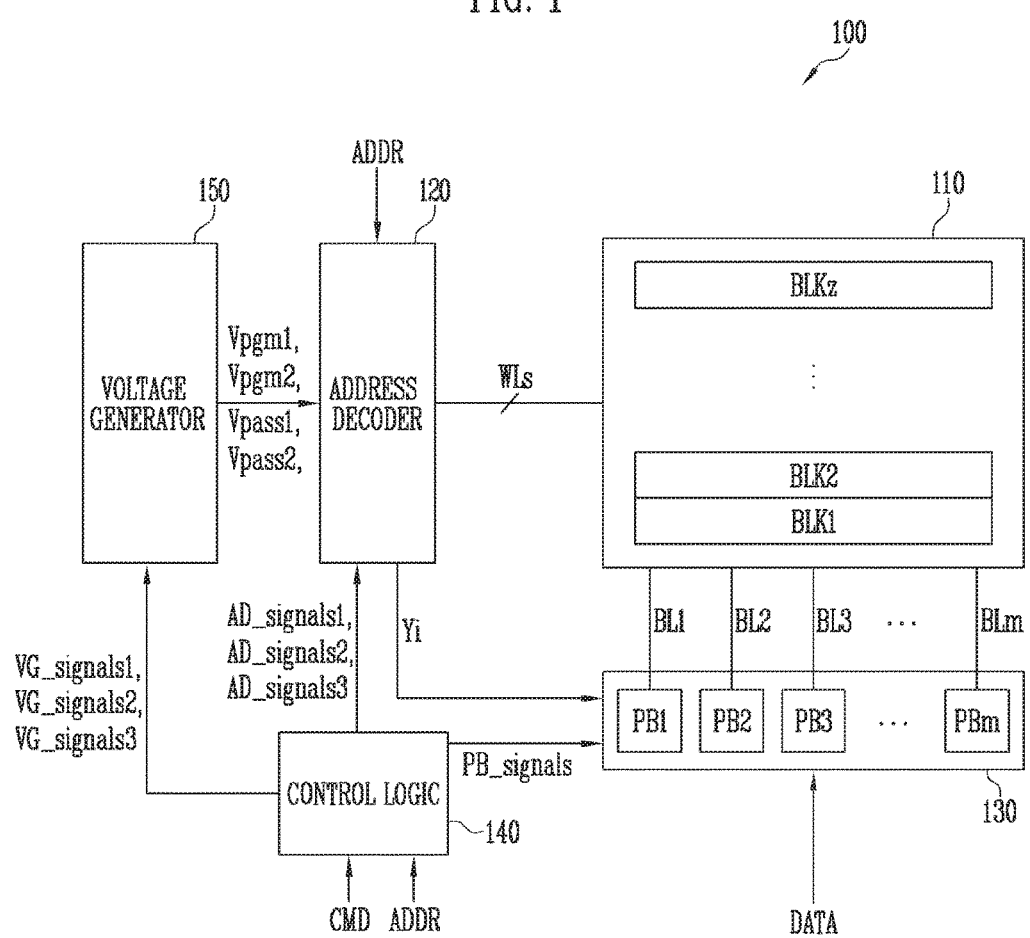
FIG. 1 is a block diagram illustrating a semiconductor memory device according to an embodiment of the present disclosure.

FIG. 1 is a block diagram illustrating a semiconductor memory device 100 according to an embodiment of the present disclosure.

Referring to FIG. 1, the semiconductor memory device 100 may include a memory cell array 110, an address decoder 120, a read and write circuit 130, a control logic 140, and a voltage generator 150.

The address decoder 120, the read and write circuit 130, and the voltage generator 150 may be defined as peripheral circuits configured to perform general operations including a program operation, an erase operation, and a read operation on the memory cell array 110.

The memory cell array 110 may include a plurality of memory blocks BLK1 to BLKz. The plurality of memory blocks BLK1 to BLKz may be coupled to the address decoder 120 through word lines WLs. The memory blocks BLK1 to BLKz may be coupled to the read and write circuit 130 through bit lines BL1 to BLm. According to an embodiment, a plurality of memory cells may be non-volatile memory cells based on a charge trap device. A plurality of memory cells coupled in common to the same word line may be defined as one page. The memory cell array 110 may include a plurality of pages.

A detailed configuration of the memory cell array 110 will be described below.

The address decoder 120 may be coupled to the memory cell array 110 through the word lines WLs. The address decoder 120 may be configured to operate in response to control signals AD_signals1, AD_signals2, and AD_signals3 output from the control logic 140. The address decoder 120 may receive an address ADDR through an input/output buffer (not illustrated) in the semiconductor memory device 100. The address decoder 120 may apply a first program voltage Vpgm1 and a second program voltage Vpgm2 to a selected word line, among the word lines WLs, in response to the address ADDR and the control signals AD_signals1, a first pass voltage Vpass1 to word lines adjacent to the selected word line, among unselected word lines, in response to the address ADDR and the control signals AD_signals2, and a second pass voltage Vpass2 to the remaining unselected word lines in response to the address ADDR and the control signals AD_signals3, during a program operation.

In addition, the address ADDR received during various general operations including a program operation, a read operation, and an erase operation of the semiconductor memory device 100 may include a block address, a row address, and a column address. The address decoder 120 may select one memory block and one word line in response to the block address and the row address. A column address Yi may be decoded by the address decoder 120 and provided to the read and write circuit 130.

The address decoder 120 may include a block decoder, a row decoder, a column decoder, and an address buffer.

The read and write circuit 130 may include a plurality of page buffers PB1 to PBm. The plurality of page buffers PB1 to PBm may be coupled to the memory cell array 110 through the bit lines BL1 to BLm. Each of the plurality of page buffers PB1 to PBm may control potential levels of the corresponding bit lines BL1 to BLm according to data to be programmed during the program operation. For example, during the program operation, each of the page buffers PB1 to PBm may apply a program inhibit voltage (e.g., power voltage) when a corresponding memory cell is a program inhibit cell, and may control a potential level of a program allowable voltage according to a program state corresponding to data to be programmed when the corresponding memory cell is a program cell.

The read and write circuit 130 may operate in response to control signals PB_signals output from the control logic 140.

The control logic 140 may be coupled to the address decoder 120, the read and write circuit 130, and the voltage generator 150. The control logic 140 may receive a command CMD through the input/output buffer (not illustrated) of the semiconductor memory device 100. The control logic 140 may be configured to control general operations of the semiconductor memory device 100, such as a program operation, a read operation, and an erase operation, in response to the command CMD. In other words, the control logic 140 may output a plurality of control signals (AD_signals1, AD_signals2, AD_signals3, PB_signals, VG_signals1, VG_signals2, and VG_signals3) to control the address decoder 120, the read and write circuit 130, and the voltage generator 150 in response to the command CMD.

The control logic 140 may control the voltage generator 150 and the address decoder 120 so that the first program voltage Vpgm1 and the second program voltage Vpgm2 may be sequentially applied to the selected word line, among the plurality of word lines WLs of a selected memory block, during the program operation.

The control logic 140 may control the voltage generator 150 and the address decoder 120 so that the first pass voltage Vpass1 may be applied to word lines adjacent to the selected word line, among the plurality of word lines WLs, and the second program voltage Vpass2 may be applied to the remaining unselected word lines during the program operation. Each of the first pass voltage Vpass1 and the second pass voltage Vpass2 may have a rising period increasing from a first level to a second level, and the rising period of the first pass voltage Vpass1 may be different from that of the second pass voltage Vpass2.

In addition, the control logic 140 may control the voltage generator 150 so that the second pass voltage Vpass2 applied to the unselected word lines may be gradually increased by a step voltage when increasing from the first level to the second level.

The address decoder 150 may operate in response to the control signals VG_signals1, VG_signals2, and VG_signals3 output from the control logic 140.

For example, during the program operation, the voltage generator 150 may generate the first and second program voltages Vpgm1 and Vpgm2 to be applied to the selected word line in response to the control signals VG_signals1, the first pass voltage Vpass1 to be applied to the word lines adjacent to the selected word line in response to the control signals VG_signals2, and the second pass voltage Vpass2 to be applied to the unselected word lines, except for the adjacent word lines, in response to the control signals VG_signals3.

Figure 2:
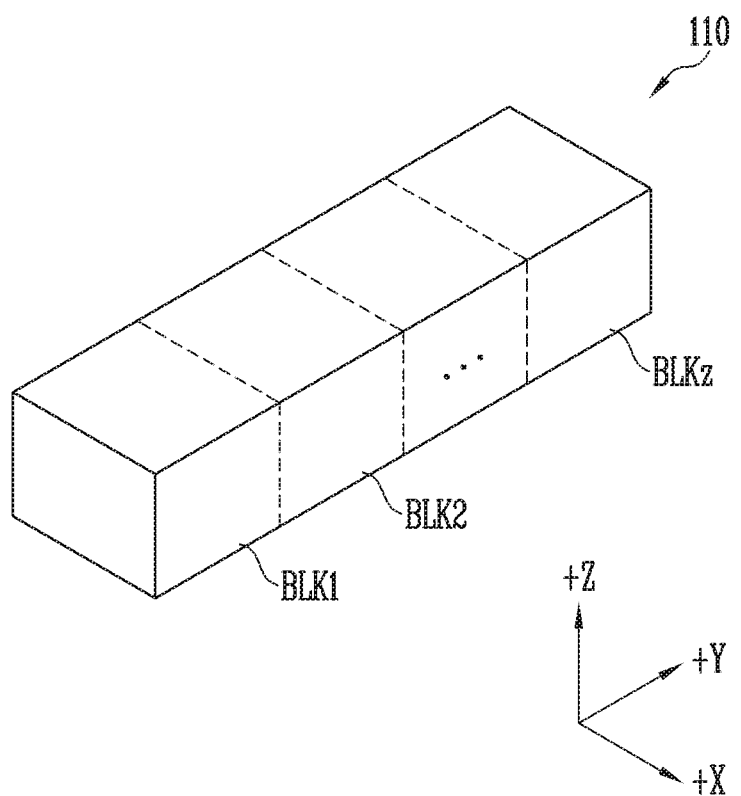
FIG. 2 is a block diagram illustrating a memory cell array shown in FIG. 1.

FIG. 2 is a block diagram illustrating an embodiment of the memory cell array 110 shown in FIG. 1.

Referring to FIG. 2, the memory cell array 110 may include the plurality of memory blocks BLK1 to BLKz. Each memory block may have a three-dimensional (3D) structure. Each memory block may include a plurality of memory cells stacked over a substrate. The plurality of memory cells may be arranged in +X direction, +Y direction and +Z direction. The structure of each memory block will be described in more detail with reference to FIG. 3.

Figure 3:
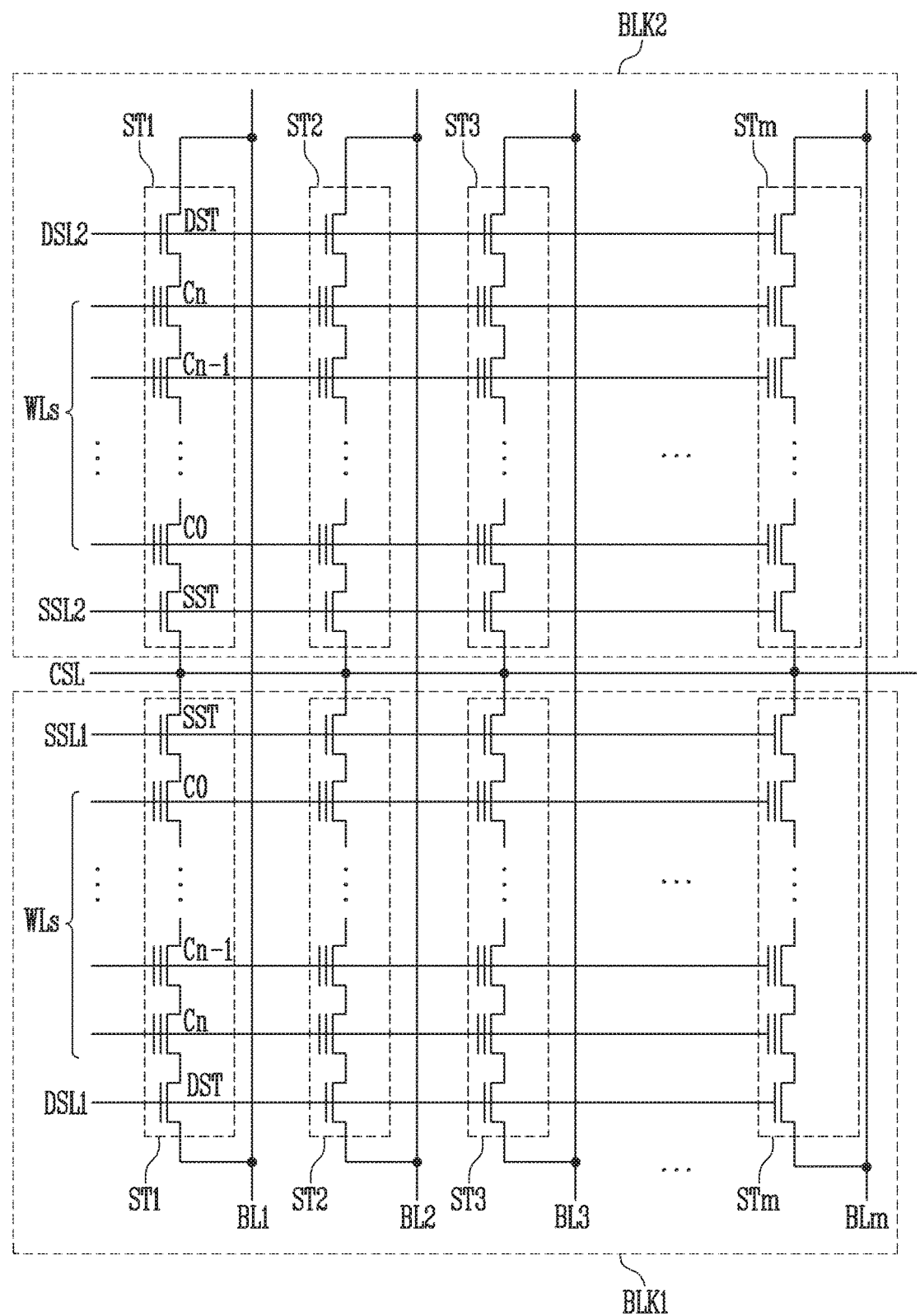
FIG. 3 is a circuit diagram illustrating a memory block shown in FIG.

FIG. 3 is a circuit diagram illustrating the memory blocks BLK1 to BLKz shown in FIG. 1.

As shown in FIG. 1, the plurality of memory blocks BLK1 to BLKz may be coupled to the read and write circuit 130 through the bit lines BL1 to BLm. However, as shown in FIG. 3, for illustrative purpose, the memory block BLK1 and the memory block BLK2 will be illustrated as representative examples. The memory block BLK1 and the memory block BLK2 may share the bit lines BL1 to BLm and the common source line CSL.

Referring to FIG. 3, the memory block BLK1 and the memory block BLK2 may be coupled to the plurality of bit lines BL1 to BLm.

The memory block BLK1 may include a plurality of cell strings ST1 to STm. Each of the plurality of cell strings ST1 to STm may be coupled between the plurality of bit lines BL1 to BLm and a common source line CSL. Each of the plurality of cell strings ST1 to STm may include a source selection transistor SST, a plurality of memory cells C0 to Cn coupled in series, and a drain selection transistor DST. The source selection transistor SST may be coupled to a source selection line SSL1. Each of the plurality of memory cells C0 to Cn may be coupled to the word lines WLs. The drain selection transistor DST may be coupled to a drain selection line DSL1. The common source line CSL may be coupled to a source side of the source selection transistor SST. Each of the bit lines BL1 to BLm may be coupled to a drain side of the corresponding drain selection transistor DST.

The memory block BLK2 may have a similar structure to that of the memory block BLK1. In other words, the memory block BLK2 may include the plurality of cell strings ST1 to STm, and each of the cell strings ST1 to STm may be coupled between each of the plurality of bit lines BL1 to BLm and the common source line CSL. Each of the plurality of cell strings ST1 to STm may include the source selection transistor SST, the plurality of memory cells C0 to Cn coupled in series, and the drain selection transistor DST. The source selection transistor SST may be coupled to a source selection line SSL2. Each of the plurality of memory cells C0 to Cn may be coupled to the word lines WLs. The drain selection transistor DST may be coupled to a drain selection line DSL2. The common source line CSL may be coupled to a source side of the source selection transistor SST. Each of the bit lines BL1 to BLm may be coupled to a drain side of the corresponding drain selection transistor DST.

As described above, the memory block BLK1 and the memory block BLK2 may have similar structures, and the drain selection lines DSL1 and DSL2 and the source selection lines SSL1 and SSL2 respectively coupled thereto may be electrically separated from each other.

Figure 4:
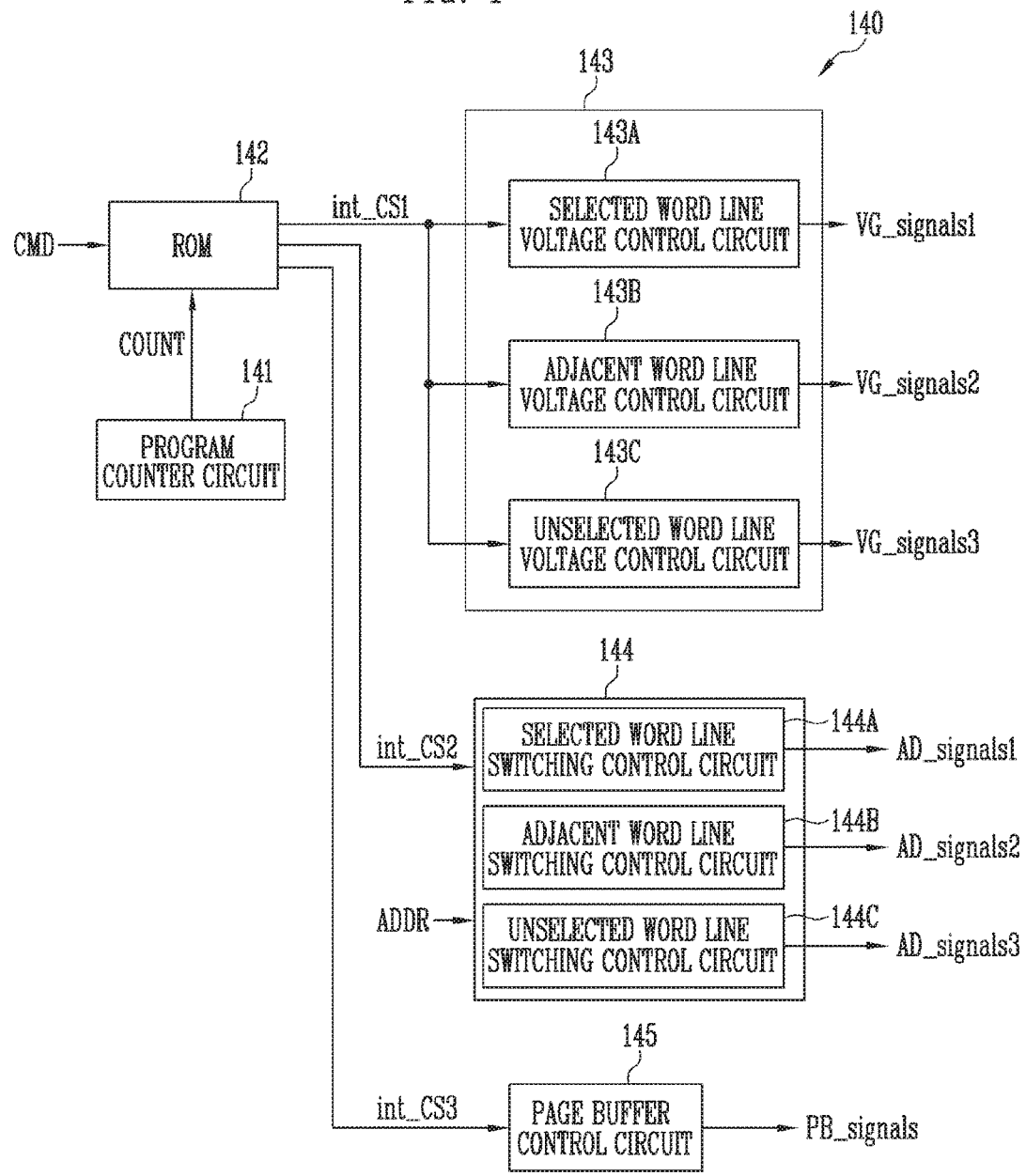
FIG. 4 is a block diagram illustrating an embodiment of a control logic shown in FIG. 1.

FIG. 4 is a block diagram illustrating an embodiment of the control logic 140 shown in FIG.

Referring to FIG. 4, the control logic 140 may include a program counter circuit 141, a read only memory (ROM) 142, a voltage generation control circuit 143, an address decoder control circuit 144, and a page buffer control circuit 145.

The program counter circuit 141 may generate and output a counting signal COUNT that is counted at a predetermined cycle during general operations of the semiconductor memory device 100.

The ROM 142 may store an algorithm for various operations of the semiconductor memory device 100, such as a program operation, a read operation, and an erase operation. The ROM 142 may output a plurality of internal control signals int_CS1 to int_CS3 in response to the counting signal COUNT and the command CMD input from a host coupled to the semiconductor memory device 100.

The voltage generation control circuit 143 may output the plurality of control signals VG_signals1, VG_signals2, and VG_signals3 in response to the internal control signal int_CS1. The voltage generation control circuit 143 may include a selected word line voltage control circuit 143A, an adjacent word line voltage control circuit 143B, and an unselected word line voltage control circuit 143C.

The selected word line voltage control circuit 143A may generate and output the control signals VG_signals1 in response to the internal control signal int_CS1. The control signals VG_signals1 may be applied to control the voltage generator 150 of FIG. 1 so that operating voltages, such as a first program voltage and a second program voltage, may be applied to the selected word line during a program operation.

The adjacent word line voltage control circuit 143B may output the control signals VG_signals2 in response to the internal control signal int_CS1. The control signals VG_signals2 may be applied to control the voltage generator 150 of FIG. 1 so that operating voltages, such as a first pass voltage, may be applied to word lines adjacent to the selected word line during the program operation.

The unselected word line voltage control circuit 143C may output the control signals VG_signals3 in response to the internal control signal int_CS1. The control signals VG_signals3 may be applied to control the voltage generator 150 of FIG. 1 so that operating voltages, such as a second pass voltage, may be applied to the remaining unselected word lines except for the word lines adjacent to the selected word line during the program operation. The control signals VG_signals3 may be applied to control the voltage generator 150 of FIG. 1 so that a rising period of the first pass voltage applied to the adjacent word lines and a rising period of the second pass voltage applied to the unselected word lines may be different from each other, or so that the second pass voltage may be gradually increased by a step voltage from a first level to a second level.

The address decoder control circuit 144 may generate and output control signals AD_signals1, AD_signals2, and AD_signals3 to control the address decoder 120 of FIG. 1 in response to the internal control signal int_CS2 and the address signal ADDR.

The address decoder control circuit 144 may include a selected word line switching control circuit 144A, an adjacent word line switching control circuit 144B, and an unselected word line switching control circuit 144C. The selected word line switching control circuit 144A may generate and output the control signals AD_signals1 so that the address decoder 120 of FIG. 1 may apply the first and second program voltages to a selected word line in response to the internal control signal int_CS2 and the address signal ADDR. The adjacent word line switching control circuit 144B may generate and output the control signals AD_signals2 so that the address decoder 120 of FIG. 1 may apply the first pass voltage to word lines adjacent to the selected word line in response to the internal control signal int_CS2 and the address signal ADDR. The unselected word line switching control circuit 144C may generate and output the control signals AD_signals3 so that the address decoder 120 of FIG. 1 may apply the second pass voltage to the remaining unselected word lines in response to the internal control signal int_CS2 and the address signal ADDR.

The page buffer control circuit 145 may generate and output the control signals PB_signals to control the read and write circuit 130 of FIG. 1 in response to the internal control signal int_CS3 and the address signal ADDR.

Figure 5:
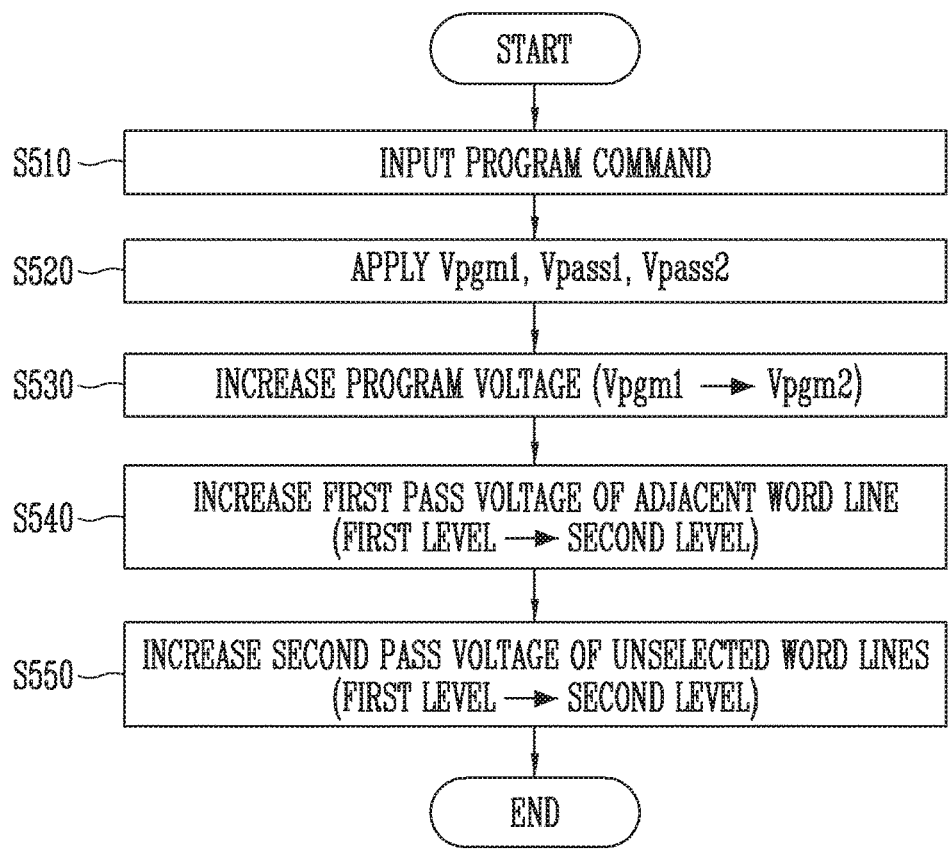
FIG. 5 is a flowchart illustrating operations of a semiconductor memory device according to an embodiment of the present disclosure.

FIG. 5 is a flowchart illustrating operations of a semiconductor memory device according to an embodiment of the present disclosure.

Figure 6:
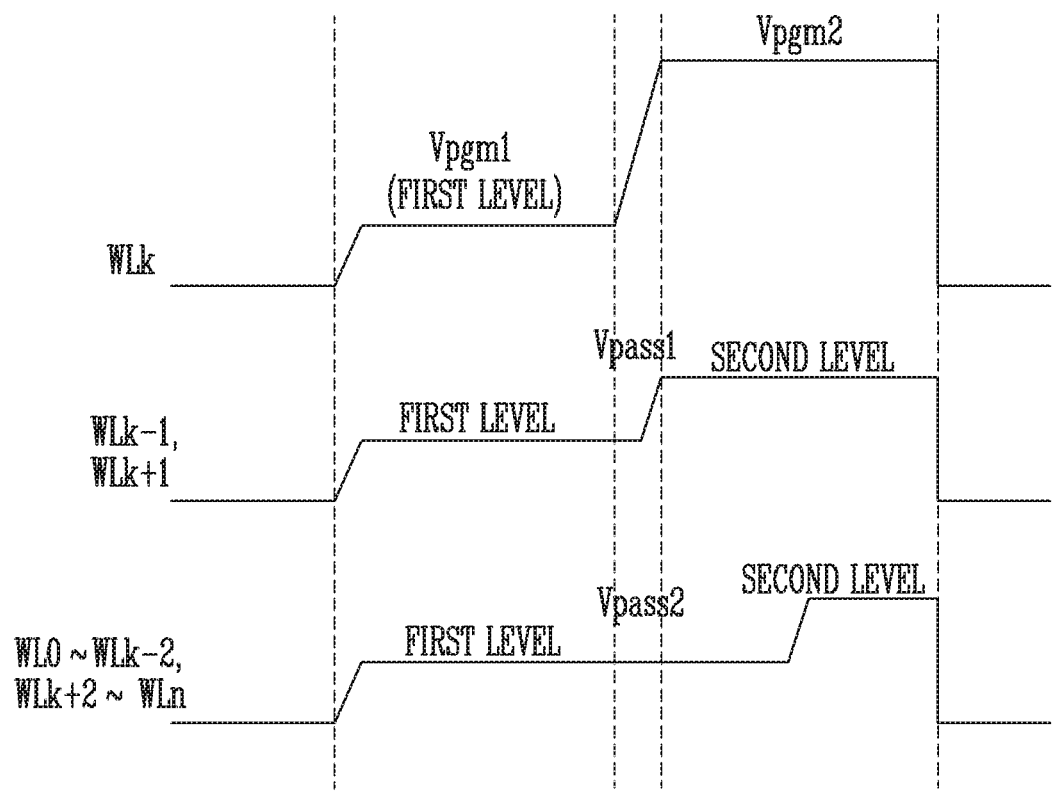
FIG. 6 is a waveform diagram of operating voltages for illustrating operations of a semiconductor memory device according to an embodiment of the present disclosure.

FIG. 6 is a waveform diagram of operating voltages for illustrating operations of a semiconductor memory device according to an embodiment of the present disclosure.

In describing the operations of the semiconductor memory device 100 in accordance with an embodiment of the present disclosure, references will be made to FIGS. 1 to 6.

When the command CMD with respect to a program command is externally input at step S510, the read and write circuit 130 may temporarily store externally input data DATA and control potential levels of the bit lines BL1 to BLm respectively corresponding to the temporarily stored data DATA in response to the control signals PB_signals output from the control logic 140.

The voltage generator 150 may generate the first program voltage Vpgm1, the first pass voltage Vpass1, and the second pass voltage Vpass2 in response to the control signals VG_signals1, VG_signals2, and VG_signals3 output from the control logic 140. The first program voltage Vpgm1 may have the same potential level as the first level of each of the first pass voltage Vpass1 and the second pass voltage Vpass2.

The address decoder 120 may apply the first program voltage Vpgm1 generated by the voltage generator 150 to a selected word line (e.g., WLk) of a selected memory block (e.g., BLK1), apply the first pass voltage Vpass1 to adjacent word lines (e.g., WLk−1 and WLk+1), and apply the second pass voltage Vpass2 to the remaining unselected word lines (WL0 to WLk−2 and WLk+2 to WLn) in response to the control signals AD_signals1, AD_signals2, and AD_signals3 output from the control logic 140 and the address ADD, at step S520.

At step S530, the voltage generator 150 may increase the potential level of the first program voltage Vpgm1 to output the second program voltage Vpgm2 in response to the control signals VG_signals1 output from the control logic 140. The address decoder 120 may apply the second program voltage Vpgm2 to the selected word line WLk.

In addition, at step S540, the voltage generator 150 may output the first pass voltage Vpass1 having a second level by increasing the potential level of the first pass voltage Vpass1 applied to the adjacent word lines WLk−1 and WLk+1 from the first level to the second level in response to the control signals VG_signals2 output from the control logic 140.

The address decoder 120 may apply the first pass voltage Vpass1 having the second level to the adjacent word lines WLk−1 and WLk+1. According to an embodiment, word lines adjacent to a selected word line have been described as two word lines arranged in both directions of the selected word line, respectively. However, the present invention is not limited thereto. That is, at least one word line arranged in both directions of the selected word line may be defined as adjacent word lines.

At step S550, after a predetermined amount of time when the first pass voltage Vpass1 applied to the adjacent word lines WLk−1 and WLk+1 increases from the first level to the second level, the voltage generator 150 may output the second pass voltage Vpass2 having the second level by increasing the potential level of the second pass voltage Vpass2 applied to the remaining unselected word lines WL0 to WLk−2 and WLk+2 to WLn, except for the adjacent word lines WLk−1 and WLk+1, in response to the control signals VG_signals3 output from the control logic 140. The address decoder 120 may apply the second pass voltage Vpass2 having the second level to the unselected word lines WL0 to WLk−2 and WLk+2 to WLn. In other words, the second pass voltage Vpass2 applied to the remaining unselected word lines WL0 to WLk−2 and WLk+2 to WLn may increase from the first level to the second level later than the first pass voltage Vpass1 applied to the adjacent word lines WLk−1 and WLk+1. According to an embodiment, the rising period of the first pass voltage Vpass1 may be earlier than the rising period of the second pass voltage Vpass2. However, the present disclosure is not limited thereto. That is, according to an embodiment, the rising period of the second pass voltage Vpass2 may be earlier than the rising period of the first pass voltage Vpass1.

Thereafter, the program operation may be terminated by discharging the potential levels of the selected word line WLk, the adjacent word lines WLk−1 and WLk+1, and the unselected word lines WL0 to WLk−2 and WLk+2 to WLn.

According to the above-described embodiment, the first pass voltage applied to the word lines adjacent to the selected word line and the second pass voltage applied to the remaining unselected word lines may be increased from the first level to the second level. As a result, a channel boosting level of a selected memory cell coupled to the selected word line may be increased, so that program of the selected memory cell may be facilitated.

In addition, by setting the first and second pass voltages to have different rising periods, a channel boosting level of a cell string in a program inhibit mode where a program operation is not performed may be increased. Accordingly, this may prevent the channel boosting level from decreasing due to the leakage current in the cell string of the program inhibit mode, thereby improving the program disturb phenomenon.

Figure 7:
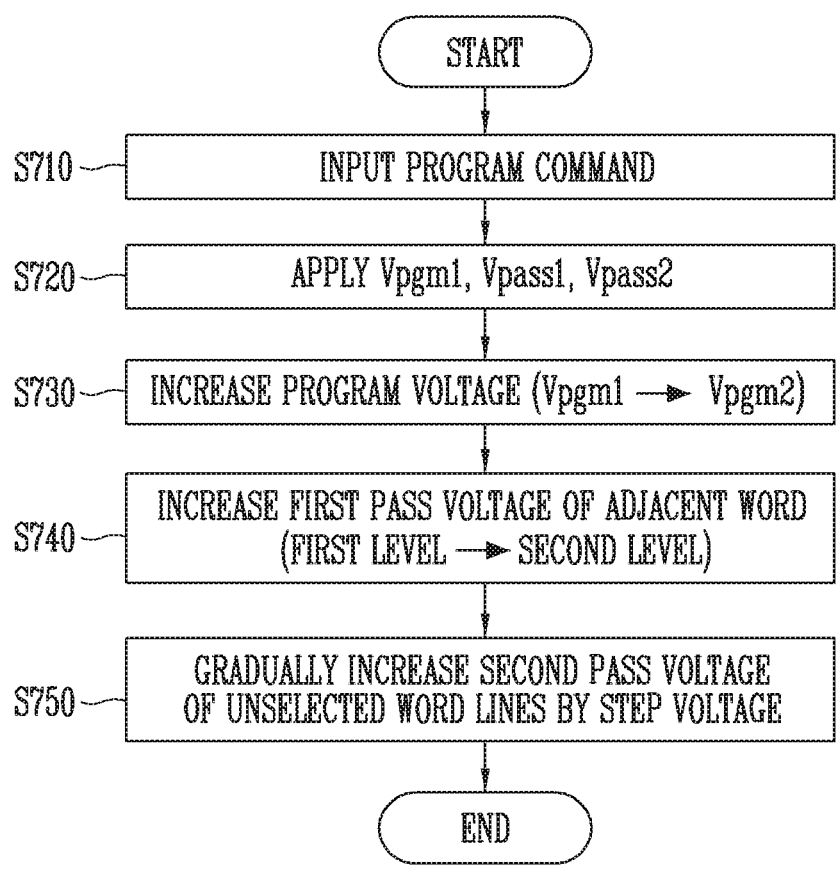
FIG. 7 is a flowchart illustrating operations of a semiconductor memory device according to another embodiment of the present disclosure.

FIG. 7 is a flowchart illustrating operations of a semiconductor memory device according to another embodiment of the invention.

Figure 8:
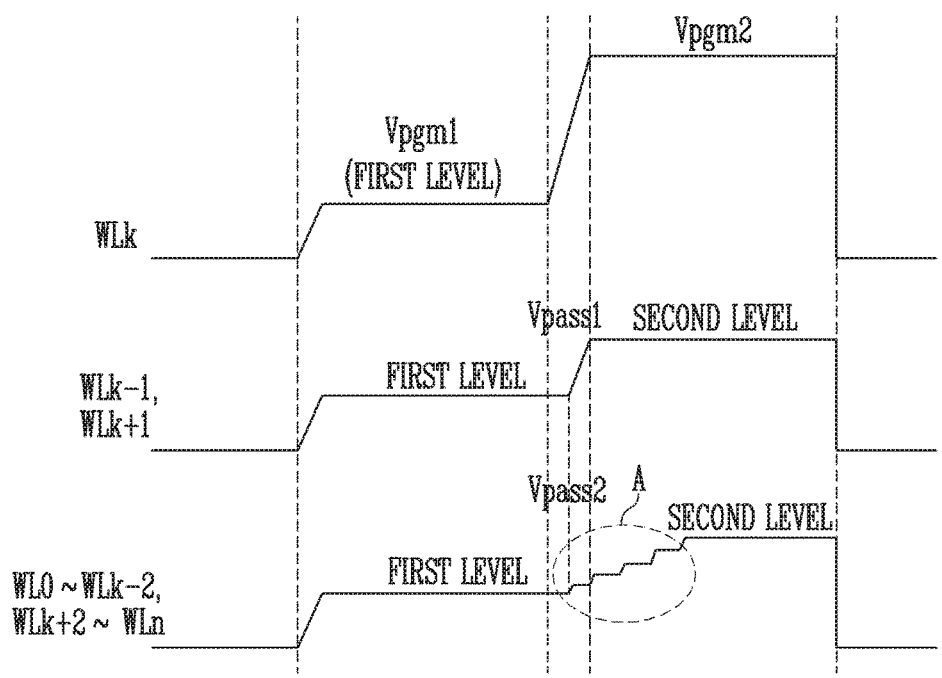
FIGS. 8 and 9 are waveform diagrams of operating voltages for illustrating operations of a semiconductor memory device according to an embodiment of the present disclosure.

FIG. 8 is a waveform diagram of operating voltages for illustrating operations of a semiconductor memory device according to another embodiment of the present disclosure.

In describing the operations of the semiconductor memory device 100 according to another embodiment of the present disclosure, references will be made to FIGS. 1 to 4, 7, and 8.

At step S710, when the command CMD with respect to a program command is externally input, the read and write circuit 130 may temporarily store externally input data and control potential levels of the bit lines BL1 to BLm respectively corresponding to the temporarily stored data DATA in response to the control signals PB_signals output from the control logic 140.

The voltage generator 150 may generate the first program voltage Vpgm1, the first pass voltage Vpass1, and the second pass voltage Vpass2 in response to the control signals VG_signals1, VG_signals2, and VG_signals3 output from the control logic 140. The first program voltage Vpgm1 may have the same potential level as the first level of each of the first pass voltage Vpass1 and the second pass voltage Vpass2.

The address decoder 120 may apply the first program voltage Vpgm1 generated by the voltage generator 150 to a selected word line (e.g., WLk) of a selected memory block (e.g., BLK1), apply the first pass voltage Vpass1 to adjacent word lines (e.g., WLk−1 and WLk+1), and apply the second pass voltage Vpass2 to the remaining unselected word lines (WL0 to WLk2 and WLk+2 to WLn) in response to the control signals AD_signals1, AD_signals2, and AD_signals3 output from the control logic 140 and the ADDR, at step S720.

At step S730, the voltage generator 150 may increase the potential level of the first program voltage Vpgm1 to output the second pass voltage Vpgm2 in response to the control signals VG_signals1 output from the control logic 140. The address decoder 120 may apply the second program voltage Vpgm2 to the selected word line WLk.

Subsequently, at step S740, the voltage generator 150 may output the first pass voltage Vpass1 having a second level by increasing the potential level of the first pass voltage Vpass1 applied to the adjacent word lines WLk−1 and WLk+1 from the first level to the second level in response to the control signals VG_signals2 output from the control logic 140.

The address decoder 120 may apply the first pass voltage Vpass1 having the second level to the adjacent word lines WLk−1 and WLk+1. According to an embodiment, word lines adjacent to a selected word line have been described as two word lines arranged in both directions of the selected word line, respectively. However, the present disclosure is not limited thereto. That is, according to an embodiment, at least one word line arranged in both directions of the selected word line may be defined as adjacent word lines.

At step S750, when the first pass voltage Vpass1 applied to the adjacent word lines WLk−1 and WLk+1 increases from the first level to the second level, the voltage generator 150 may output the second pass voltage Vpass2 having the second level increased gradually (as illustrated with steps in region "A" in FIG. 8) from the first level by a step voltage by increasing the potential level of the second pass voltage Vpass2 applied to the remaining unselected word lines WL0 to WLk−2 and WLk+2 to WLn, except for the adjacent word lines WLk−1 and WLk+1, in response to the control signals VG_signals3 output from the control logic 140. The address decoder 120 may apply the second pass voltage Vpass2 having the second level to the unselected word lines WL0 to WLk−2 and WLk+2 to WLn. A rising slope of the first pass voltage Vpass1 applied to the adjacent word lines WLk−1 and WLk+1 may be greater than that of the second pass voltage Vpass2 applied to the unselected word lines W0 to WLk−2 and WLk+2 to WLn. As a result, the potential levels of the adjacent word lines WLk−1 and WLk+1 may increase to the second level faster than the potential levels of the unselected word lines WL0 to WLk−2 and WLk+2 to WLn. In other words, the second pass voltage Vpass2 applied to the remaining unselected word lines WL0 to WLk−2 and WLk+2 to WLn may reach the second level later than the first pass voltage Vpass1 applied to the adjacent word lines WLk−1 and WLk+1.

Thereafter, the program operation may be terminated by discharging the potential levels of the selected word line WLk, the adjacent word lines WLk−1 and WLk+1, and the unselected word lines WL0 to WLk−2 and WLk+2 to WLn.

According to the above-described embodiment, after the first pass voltage having the first level is applied to the word lines adjacent to the selected word line, the potential level of the first pass voltage may be increased to the second level from the first level, so that a channel boosting level of a selected memory cell coupled to the selected word line may be increased. As a result, programming of the selected memory cell may be facilitated.

In addition, when the first pass voltage applied to the adjacent word lines is increased from the first level to the second level, the second pass voltage applied to the remaining unselected word lines may be increased from the first level to the second level while a rising slope is controlled so that the potential levels of the unselected word lines may reach the second level later than the potential levels of the adjacent word lines. Accordingly, a channel boosting level of a cell string in a program inhibit mode where a program operation is not performed may be increased a predetermined time after a channel boosting level of a selected memory cell is increased. Accordingly, this may prevent the channel boosting level from decreasing due to the leakage current in the cell string of the program inhibit mode, thereby improving the program disturb phenomenon.

Figure 9:
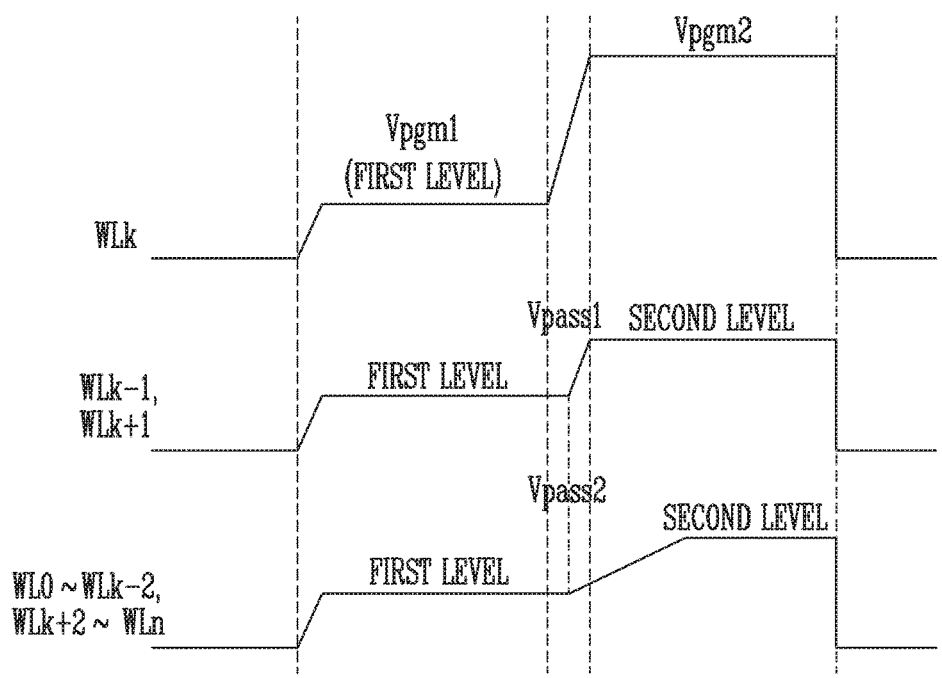

FIG. 9 is a waveform diagram illustrating operating voltages for illustrating an embodiment in which the potential level of the second pass voltage Vpass2 applied to the remaining unselected word lines WL0 to WLk−2 and WLk+2 to WLn is linearly increased from the first level to the second level.

Referring to FIG. 9, a rising slope of the first pass voltage Vpass1 applied to the adjacent word lines WLk−1 and WLk+1 may be greater than that of the second pass voltage Vpass2 applied to the unselected word lines WL0 to WLk−2 and WLk+2 to WLn. As a result, the potential levels of the adjacent word lines WLk−1 and WLk+1 may increase to the second level faster than the potential levels of the unselected word lines WL0 to WLk−2 and WLk+2 to WLn. In other words, the second pass voltage Vpass2 applied to the remaining unselected word lines WL0 to WLk−2 and WLk+2 to WLn may reach the second level later than the first pass voltage Vpass1 applied to the adjacent word lines WLk−1 and WLk+1. In addition, a potential level of a channel may continue to be recovered during a period when the second pass voltage Vpass2 is increased.

Figure 10:
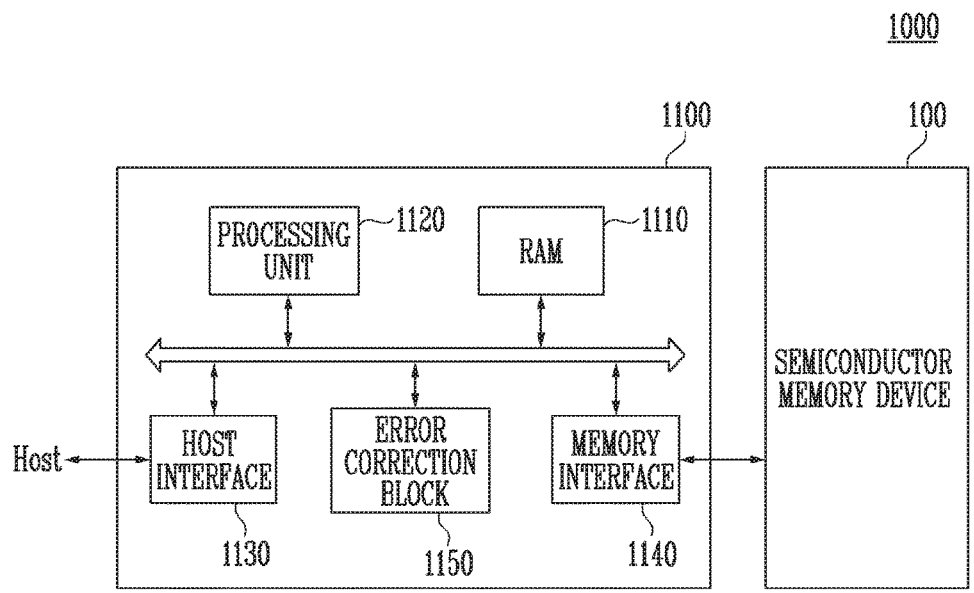
FIG. 10 is a block diagram illustrating a memory system including a semiconductor memory device shown in FIG.

FIG. 10 is a block diagram illustrating a memory system including the semiconductor memory device 100 shown in FIG. 1.

Referring to FIG. 10, the memory system 1000 may include the semiconductor memory device 100 and a controller 1100.

The semiconductor memory device 100 may be configured and operated in substantially the same manner as described above with reference to FIG. 1. Hereinafter, repetitive explanations will be omitted.

The controller 1100 may be coupled to a host and the semiconductor memory device 100. The controller 1100 may be configured to access the semiconductor memory device 100 in response to a request from the host. For example, the controller 1100 may control a read operation, a write operation, a program operation, an erase operation, and/or a background operation of the semiconductor memory device 100. The controller 1100 may be configured to provide an interface between the semiconductor memory device 100 and the host. The controller 1100 may be configured to drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of an operation memory of the processing unit 1120, a cache memory between the semiconductor memory device 100 and the host, and a buffer memory between the semiconductor memory device 100 and the host. The processing unit 1120 may control general operations of the controller 1100. In addition, the controller 1100 may temporarily store program data provided from the host during a write operation.

The host interface 1130 may include a protocol for performing data exchange between the host and the controller 1100. In an example of an embodiment, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 may interface with the semiconductor memory device 100. For example, the memory interface includes a NAND interface or a NOR interface.

The error correction block 1150 may use an error correcting code (ECC) to detect and correct an error in data received from the semiconductor memory device 100. The processing unit 1120 may control a read voltage according to an error detection result of the error correction block 1150 and control the semiconductor memory device 100 to perform re-read. According to an exemplary embodiment, the error correction block 1150 may be provided as one of the components of the controller 1100.

The controller 1100 and the semiconductor memory device 100 may be integrated into a single semiconductor device. In an example of an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The solid state drive SSD may include a storage device configured to store data in a semiconductor memory. When the memory system 1000 is used as the SSD, an operation speed of the host coupled to the memory system 1000 may be significantly improved.

In another example, the memory system 1000 may be provided as one of various elements of an electronic device such as a computer, a ultra-mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture player, a digital picture recorder, a digital video recorder, a device capable of transmitting/receiving information in an wireless environment, one of various devices for forming a home network, one of various electronic devices for forming a computer network, one of various electronic devices for forming a telematics network, an RFID device, or one of various elements for forming a computing system, or the like.

In an exemplary embodiment, the semiconductor memory device 100 or the memory system 1000 may be embedded in packages if various forms. For example, the semiconductor memory device 100 or the memory system 1000 may be embedded in packages such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), a wafer-level fabricated package (WFP), a wafer-level processed stack package (WSP), or the like.

Figure 11:
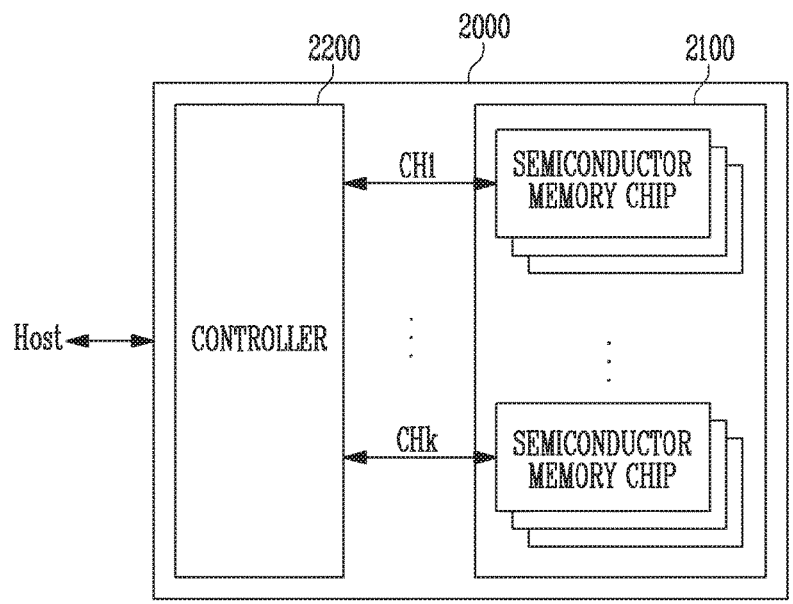
FIG. 11 is a block diagram illustrating an application example of a memory system of FIG. 10.

FIG. 11 is a block diagram illustrating an application example of the memory system 1000 of FIG. 10.

Referring to FIG. 11, the memory system 2000 may include a semiconductor memory device 2100 and a controller 2200. The semiconductor memory device 2100 may include a plurality of semiconductor memory chips. The plurality of semiconductor memory chips may be divided into groups.

FIG. 11 illustrates each of the plurality of groups as communicating with the controller 2200 through first to kth channels CH1 to CHk. Each of the semiconductor memory chips may be configured and operated in substantially the same manner as the semiconductor memory device 100 described above with reference to FIG. 1.

Each group may be configured to communicate with the controller 2200 through a single common channel. The controller 2200 may be configured in substantially the same manner as the controller 1100 described above with reference to FIG. 9, and configured to control the plurality of memory chips of the semiconductor memory device 2100 through the plurality of channels CH1 to CHk.

Figure 12:
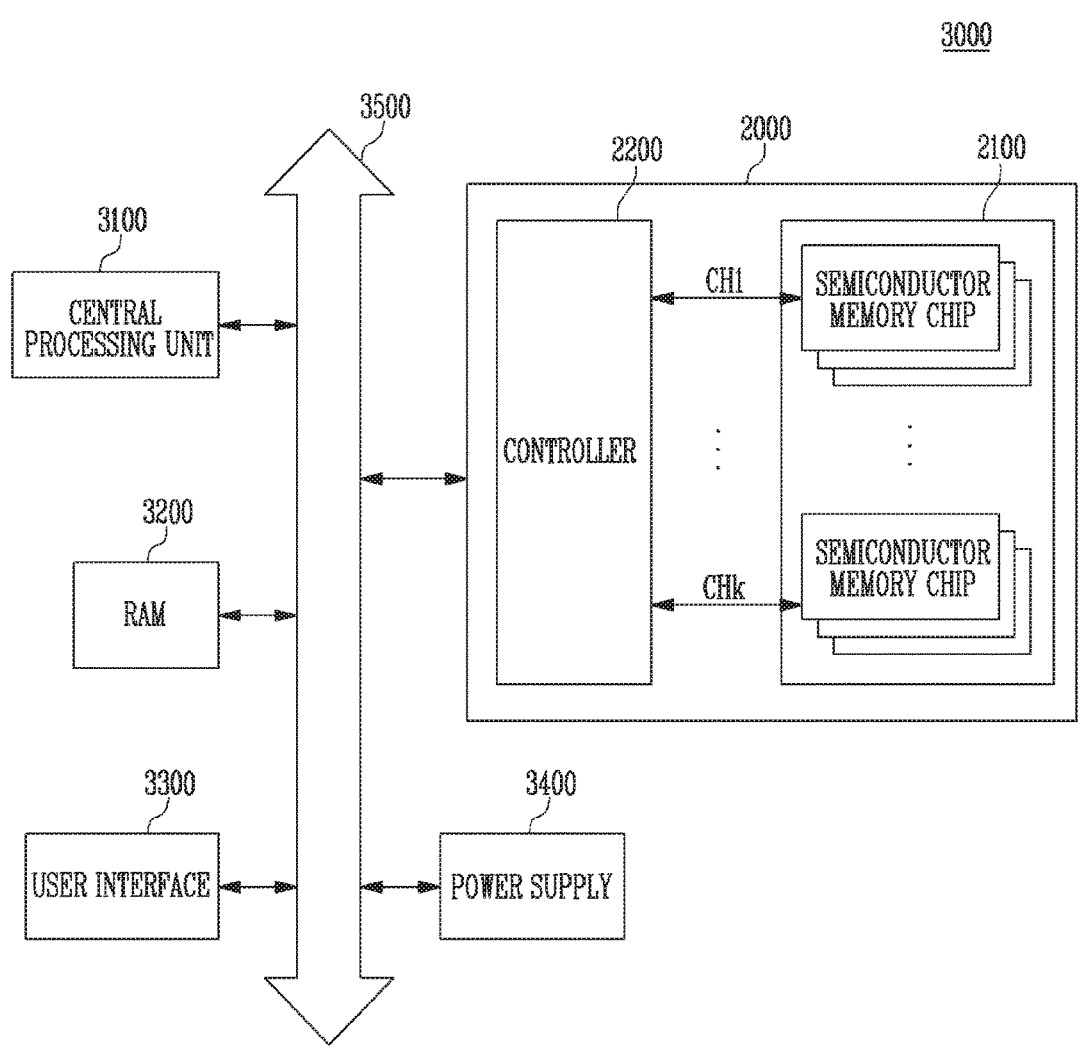
FIG. 12 is a block diagram illustrating a computing system including a memory system described with reference to FIG. 11.

FIG. 12 is a block diagram illustrating a computing system 3000 including the memory system 2100 described with reference to FIG. 11.

Referring to FIG. 12, the computing system 3000 may include a central processing unit 3100, a RAM 3200, a user interface 3300, a power supply 3400, a system bus 3500, and a memory system 2000.

The memory system 2000 may be electrically connected to the central processing unit 3100, the RAM 3200, the user interface 3300, and the power supply 3400 through the system bus 3500. Data provided through the user interface 3300 or data processed by the central processing unit 3100 may be stored in the memory system 2000.

Referring to FIG. 12, the semiconductor memory device 2100 is illustrated as being coupled to the system bus 3500 through the controller 2200. However, the semiconductor memory device 2100 may be directly coupled to the system bus 3500. The functions of the controller 2200 may be performed by the central processing unit 3100 and the RAM 3200.

Referring to FIG. 12, the memory system 2000 described with reference to FIG. 11 may be provided. However, the memory system 2000 may be replaced with the memory system 1000 described with reference to FIG. 10. According to an embodiment, the computing system 3000 may include both of the memory systems 1000 and 2000 described above with reference to FIGS. 10 and 11, respectively.

According to embodiments, a program disturb phenomenon may be improved by controlling pass voltages applied to word lines adjacent to a selected word line and unselected word lines during a program operation of a semiconductor memory device.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor memory device, comprising:
a memory cell array coupled to a plurality of word lines;
a voltage generator generating a program voltage and first and second pass voltages in response to voltage generation control signals;
an address decoder selectively applying the program voltage and the first and second pass voltages to the plurality of word lines in response to address decoder control signals; and
a control logic controlling the voltage generator and the address decoder to perform a program operation,
wherein the control logic comprises:
a voltage generation control circuit generating the voltage generation control signals for controlling the peripheral circuit to generate the first pass voltage and the second pass voltage having rising periods different from each other; and
an address decoder control circuit generating the address decoder control signals for controlling the peripheral circuit to apply the program voltage to a selected word line, among the plurality of word lines, to apply the first pass voltage to first word lines adjacent to the selected word line, and to apply the second pass voltage to second word lines, except the first word lines and the selected word line.

2. The semiconductor memory device of claim 1, wherein a potential level of each of the first pass voltage and the second pass voltage increases from a first level to a second level during each of the rising periods.

3. The semiconductor memory device of claim 2, wherein the program voltage includes a first program voltage and a second program voltage having a higher potential level than the first program voltage, and
the peripheral circuit continuously applies the first program voltage and the second program voltage to the selected word line.

4. The semiconductor memory device of claim 3, wherein a potential level of the first program voltage is the same as the first level of each of the first and second pass voltages.

5. The semiconductor memory device of claim 1, wherein the control logic includes an algorithm for general operations and further includes a read only memory (ROM) outputting a plurality of internal control signals in response to an externally input command.

6. The semiconductor memory device of claim 5, wherein the voltage generation control circuit comprises:
a selected word line voltage control circuit generating a first control signal for controlling the voltage generator to control a potential level of the program voltage applied to the selected word line in response to the plurality of internal control signals;
an adjacent word line voltage control circuit generating a second control signal for controlling the voltage generator to control a potential level of the first pass voltage applied to the first word lines in response to the plurality of internal control signals; and
an unselected word line voltage control circuit generating a third control signal for controlling the voltage generator to control a potential level of the second pass voltage applied to the second word lines in response to the plurality of internal control signals.

7. The semiconductor memory device of claim 6, wherein the unselected word line voltage control circuit controls the voltage generator to apply the second pass voltage having a second level to the second word lines after a predetermined time when the first pass voltage having the second level is applied to the first word lines.

8. A semiconductor memory device, comprising:
a memory cell array including a plurality of memory cells coupled to a plurality of word lines, respectively;
a voltage generator outputting a program voltage, a first pass voltage, and a second pass voltage during a program operation;
an address decoder selectively applying the program voltage and the first and second pass voltages output from the voltage generator in response to the plurality of word lines; and
a control logic controlling the voltage generator and the address decoder to apply the program voltage to a selected word line, among the plurality of word lines, the first pass voltage to first word lines adjacent to the selected word line, and the second pass voltage to second word lines, among the plurality of word lines, except the selected word line and the first word lines, during the program operation,
wherein the control logic controls the voltage generator so that the first pass voltage and the second pass voltage increase from a first level to a second level and have rising slopes different from each other.

9. The semiconductor memory device of claim 8, wherein the control logic controls the voltage generator to output the second pass voltage having the second level to which the second pass voltage is gradually increased by a step voltage from the first level.

10. The semiconductor memory device of claim 8, wherein the control logic controls the voltage generator to output the second pass voltage having the second level to which the second pass voltage is linearly increased from the first level.

11. The semiconductor memory device of claim 8, wherein the program voltage includes a first program voltage and a second program voltage having a higher potential level than the first program voltage, and the address decoder continuously applies the first program voltage and the second program voltage to the selected word line.

12. The semiconductor memory device of claim 9, wherein the first program voltage has the same potential level as the second pass voltage having the first level.

13. The semiconductor memory device of claim 8, wherein the control logic controls the voltage generator to generate a first pass voltage having the second level by increasing the first pass voltage having the first level applied to the first word lines according to a first slope, and to generate the second pass voltage having the second level by increasing the second pass voltage having the first level applied to the second word lines according to a second slope, wherein the first slope is greater than the second slope.

14. The semiconductor memory device of claim 8, wherein the control logic controls the voltage generator so that the second pass voltage applied to the second word lines reaches a flat section of the second level later than the first pass voltage applied to the first word lines.

15. A method of operating a semiconductor memory device, the method comprising:
   applying a program voltage consisting of a first program voltage and a second program voltage to a selected memory cell; and
   applying a first pass voltage to memory cells adjacent to the selected memory cell and applying a second pass voltage to remaining unselected memory cells,
   wherein the first pass voltage and the second pass voltage have rising periods increasing from a first level to a second level and differing from each other.

16. The method of claim 15, wherein the rising period of the first pass voltage is earlier than the rising period of the second pass voltage.

17. The method of claim 15, wherein the first pass voltage has a first slope in the rising period, and the second pass voltage has a second slope in the rising period.

18. The method of claim 17, wherein the first slope is higher than the second slope.

19. The method of claim 17, wherein the second pass voltage is gradually increased by a step voltage from the first level to the second level or linearly increased from the first level to the second level.

20. The method of claim 15, wherein the first pass voltage reaches a flat section of the second level earlier than the second pass voltage.

* * * * *